(12) United States Patent
Laine et al.

(10) Patent No.: US 9,704,849 B2
(45) Date of Patent: Jul. 11, 2017

(54) ELECTROSTATIC DISCHARGE PROTECTION DEVICE STRUCTURES AND METHODS OF MANUFACTURE

(71) Applicant: FREESCALE SEMICONDUCTOR, INC., Austin, TX (US)

(72) Inventors: Jean Philippe Laine, Saint Lys (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/029,646

(22) PCT Filed: Oct. 18, 2013

(86) PCT No.: PCT/IB2013/002714
§ 371 (c)(1),
(2) Date: Apr. 15, 2016

(87) PCT Pub. No.: WO2015/056040
PCT Pub. Date: Apr. 23, 2015

(65) Prior Publication Data
US 2016/0276335 A1    Sep. 22, 2016

(51) Int. Cl.
| | |
|---|---|
| *H01L 29/66* | (2006.01) |
| *H01L 27/02* | (2006.01) |
| *H01L 29/06* | (2006.01) |
| *H01L 21/76* | (2006.01) |
| *H01L 29/866* | (2006.01) |

(Continued)

(52) U.S. Cl.
CPC .......... *H01L 27/0262* (2013.01); *H01L 21/76* (2013.01); *H01L 27/0255* (2013.01); *H01L 27/0292* (2013.01); *H01L 29/0626* (2013.01); *H01L 29/0649* (2013.01); *H01L 29/66371* (2013.01); *H01L 29/866* (2013.01);
(Continued)

(58) Field of Classification Search
CPC ............. H01L 27/0248; H01L 27/0262; H01L 27/0255; H01L 27/0292; H01L 27/0626; H01L 27/0649
USPC ........................................ 257/173, 175, 363
See application file for complete search history.

(56) References Cited

U.S. PATENT DOCUMENTS

| | | |
|---|---|---|
| 5,856,214 A | 1/1999 | Yu |
| 6,242,763 B1 | 6/2001 | Chen et al. |

(Continued)

FOREIGN PATENT DOCUMENTS

WO        9622614 A1    7/1996

OTHER PUBLICATIONS

International Search Report for Application No. PCT/IB2013/002714, Jul. 1, 2014, 14 pages.

(Continued)

*Primary Examiner* — Brook Kebede

(57) ABSTRACT

An ESD protection device comprising an SCR-type circuit including a PNP transistor and NPN transistor incorporates a Zener diode which permits the circuit to operate at comparatively low trigger voltage thresholds. Zener diode breakdown voltage is controlled by doping levels in a doped area of an N-type well. One or more diodes connected in series between the SCR circuit and the input/output terminal of the device advantageously raises the snapback voltage of the SCR circuit. The use of nitride spacers between doped regions instead of gate oxide technology significantly reduces unwanted leakage currents.

15 Claims, 6 Drawing Sheets

(51) Int. Cl.
    *H01L 23/29*    (2006.01)
    *H01L 27/12*    (2006.01)
(52) U.S. Cl.
    CPC ........ *H01L 23/291* (2013.01); *H01L 27/1203* (2013.01); *H01L 2924/0002* (2013.01)

(56) References Cited

U.S. PATENT DOCUMENTS

| | | | |
|---|---|---|---|
| 6,573,566 B2 | 6/2003 | Ker et al. | |
| 6,921,931 B2* | 7/2005 | Higashi | H01L 27/0262 257/173 |
| 2006/0125054 A1 | 6/2006 | Kim et al. | |
| 2007/0284665 A1 | 12/2007 | Nagai | |
| 2010/0181621 A1* | 7/2010 | Chang | H01L 27/0266 257/360 |
| 2012/0250194 A1 | 10/2012 | Gallerano et al. | |
| 2013/0057991 A1 | 3/2013 | Chatty et al. | |
| 2014/0367830 A1* | 12/2014 | Zhan | H01L 27/0262 257/577 |

OTHER PUBLICATIONS

Vashchenko et al., "High Holding Voltage Cascoded LVTSCR Structures for 5.5-V Tolerant ESD Protection Clamps", IEEE Transactions on Device and Materials Reliability, vol. 04, No. 2, Jun. 2004, pp. 273-280.

Russ et al., "GGSCRs: GGNMOS Triggered Silicon Contolled Rectifers for ESD Protection in Deep Sub-Micron CMOS Processes", co-copyrighted by Sarnoff Corporation and the ESD Association, 2001, 10 pages.

* cited by examiner

US 9,704,849 B2

ELECTROSTATIC DISCHARGE PROTECTION DEVICE STRUCTURES AND METHODS OF MANUFACTURE

FIELD OF THE INVENTION

This invention relates to electrostatic discharge protection device structures and methods of manufacture, such devices being suitable for use for electrostatic discharge (ESD) protection in integrated and other circuits.

BACKGROUND OF THE INVENTION

Integrated circuits (ICs) and the devices therein are at risk of damage due to electrostatic discharge (ESD) events. Accordingly, it is commonplace to provide an ESD clamp (voltage limiting device) across the input and/or other terminals of such devices and IC's.

United States patent application publication 20120295414 describes one simple type of ESD clamp device comprising a bipolar transistor which may be connected across terminals of an IC. When the voltage across the terminals rises beyond a predetermined limit, the bipolar transistor turns on, thereby limiting the voltage across the terminals to a level below that capable of damaging the IC.

U.S. Pat. No. 6,573,566 describes a low voltage-triggered SCR (silicon controlled rectifier) device for protecting against ESD. The disclosed known device uses gate structures formed from gate oxide layers. One drawback of using an oxide layer is a high tunnelling leakage current. Another aspect of this type of known device concerns the triggering of the device by transient voltages. These structures which incorporate gate oxide MOS transistors are activated by capacitance coupling between the drain and gate terminals (with a high resistance between gate and source terminals.) This kind of behaviour can be helpful for electrostatic discharge (ESD) applications but such configurations also tend to be activated by voltage disturbances such as sinusoidal waveforms. This type of behaviour can be undesirable in certain operating circumstances.

United States patent application publication US 20120281329 discloses an ESD device comprising a Zener diode connected between a ground terminal and a node for triggering an SCR circuit which, in turn, comprises an NPN bipolar transistor connected with a PNP bipolar transistor. This known device also includes a diode for suppressing the snapback effect of the SCR. When a transient voltage higher than a normal operating voltage is applied to this known device, a reverse current will pass through the Zener diode if the breakdown voltage of the Zener diode has been set to a voltage that is less than the collector-emitter breakdown voltage of either transistor. As the voltage increases, the device migrates into a bipolar junction transistor mode where the NPN transistor conducts. When the voltage increases further, the SCR is activated and begins to conduct current. The turning on of the SCR causes a drop of the reverse blocking voltage due to snapback. This effect can be suppressed to some extent by connecting one or more diodes in series with the device. However, the snapback voltage of the known device cannot so easily be adjusted owing to its layout. Another drawback of this known arrangement is that an additional layer is required in order to control breakdown voltage of the Zener diode, thus increasing device size. Also, the known arrangement uses a vertical SCR with the (vertical) base of the PNP transistor depending on an N well layer depth and so any adjustment to the collector emitter voltage of the PNP transistor is not easily achieved.

SUMMARY OF THE INVENTION

The present invention provides an electrostatic discharge protection device structure and method of manufacture as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1C:
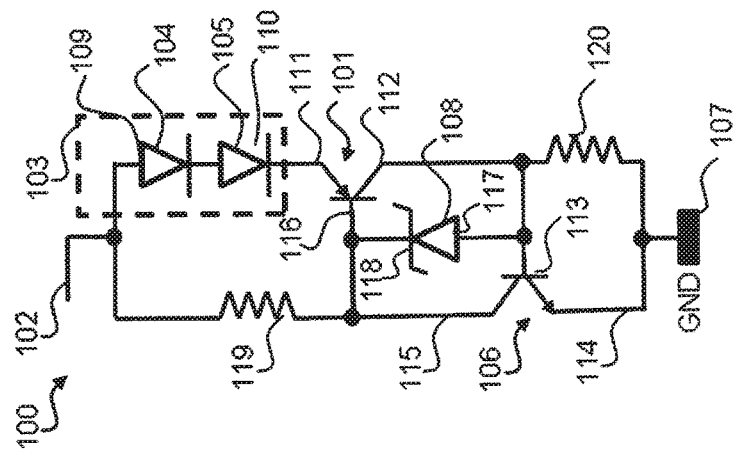
FIGS. 1A, 1B and 1C are simplified circuit diagrams of alternative examples of an electrostatic discharge protection device.
Figure 1B:
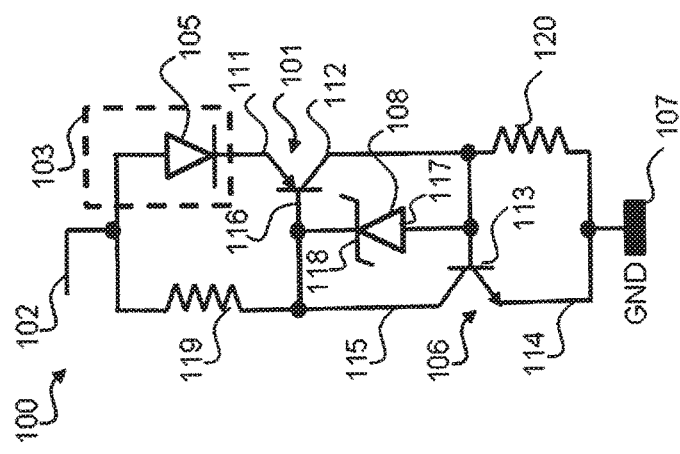
Figure 1A:
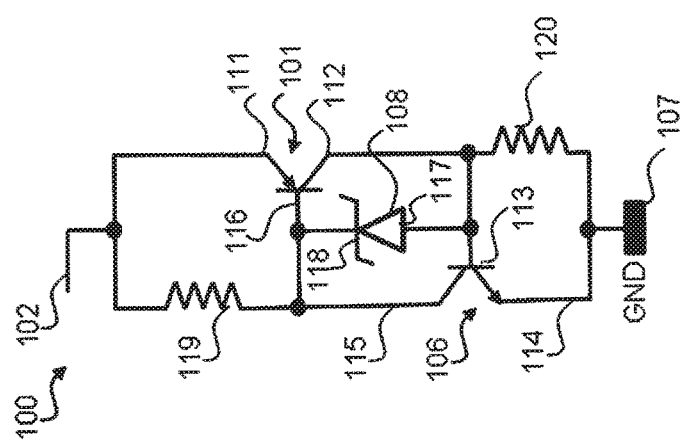

FIGS. 1A, 1B and 1C are simplified circuit diagrams of three alternative examples of an SCR ESD protection device 100. The device 100 may comprise a first type transistor 101 which may be operably coupled to a first terminal 102 of the protection device 100. In some embodiments (see FIG. 1B and FIG. 1C), the first type transistor 101 may be operably coupled to the first terminal via a diode arrangement 103. In another embodiment (see FIG. 1A) the first type transistor 101 may be operably coupled directly to the first terminal 102. Without the diode arrangement 103, the SCR snapback voltage may be typically 1.2 Volts. This may be too low for some applications, in which case one or more diodes may be included in the protection circuit 100 in order to raise the snapback voltage. So, in the embodiment of FIG. 1B, the diode arrangement 103 may comprise a single diode. In an alternative embodiment the diode arrangement 103 may comprise two or more diodes connected in series. In the embodiment illustrated in FIG. 1C a pair of diodes 104,105 comprising the diode arrangement 103 are shown.

A second type transistor 106 may be operably coupled between a second terminal 107 of the protection circuit and the first type transistor 101. The second terminal 107 may be grounded. A trigger diode, which may comprise a Zener diode 108 may be operably coupled between respective nodes of each of the first and second type transistors and arranged to operate as a reverse-biased PN junction. In the example embodiment of FIG. 1, the first type transistor may be a PNP transistor 101 and the second type transistor may be an NPN transistor 106. An anode 109 of the first 104 of the pair of diodes may be operably coupled to the first terminal 102 of the protection circuit and a cathode 110 of the second 105 of the pair of diodes may be operably coupled to an emitter node 111 of the PNP transistor 101. A collector node 112 of the PNP transistor 101 may be operably coupled to a base node 113 of the NPN type transistor 106. An emitter node 114 of the NPN transistor 106 may be operably coupled to the second terminal 107 of the protection circuit. A collector node 115 of the NPN transistor 106 may be operably coupled to a base node 116 of the PNP transistor 101. An anode 117 of the Zener diode 108 may be operably coupled with the base node 113 of the NPN transistor 106 and the collector node 112 of the PNP transistor 101. A cathode 118 of the Zener diode 108 may be operably coupled with the base node 116 of the PNP transistor 101 and the collector node 115 of the NPN transistor 106. A base to emitter resistance of the PNP transistor 101 is represented in FIG. 1 by resistance 119. A base to emitter resistance of the NPN transistor 106 is represented in FIG. 1 by resistance 120. The Zener diode 108 permits the ESD protection circuit 100 to have a low triggering voltage.

The ESD protection device 100 as described with reference to FIGS. 1A, 1B and 1C may be implemented in a single integrated circuit. The diode arrangement 103 may be isolated from the rest of the circuit components. The isolation may be achieved in a fabrication process using trench oxide sidewalls with a bottom buried oxide layer.

In operation, The ESD protection device 100 may be coupled across terminals of an integrated circuit device (not shown) requiring protection from electrostatic discharge and specifically, protection from applied voltages equal to or above a predefined threshold, Vt say. The Zener diode 108 may be arranged to have a breakdown voltage of Vt, which may be higher than the operating voltage of the integrated circuit device to be protected but lower than the collector-emitter breakdown voltage of the transistors 101, 106. This value for Vt may be set to a value suitable for 1.5 Volt applications, for example. During periods of operation where the applied voltage is less than Vt, ESD protection circuit 100 will remain inactive. However, if the voltage across terminals 102, 107 increases to Vt (or above), that is the breakdown voltage of the Zener diode 108, the Zener diode will break down and allow current to flow between the two terminals 102, 107. and through the parasitic base resistances 119, 120 of each transistor 101. Subsequently, the NPN transistor 106, then the PNP transistor 101 will be activated. In this way, the Zener diode 108, aided by the PNP transistor 101 may activate SCR operation in order to protect the integrated circuit device to which the ESD protection circuit may be coupled. At high current levels (above 10 mA, for example), a base-emitter voltage drop of typically 0.6 Volts can be achieved across the NPN transistor 106 and 1.8 Volts across the PNP transistor 101. A typical forward bias voltage value of the diode arrangement is 0.6 Volts. In one example, using the two diode arrangement of FIG. 1C may increase the snapback voltage to above 3 Volts.

Figure 2:
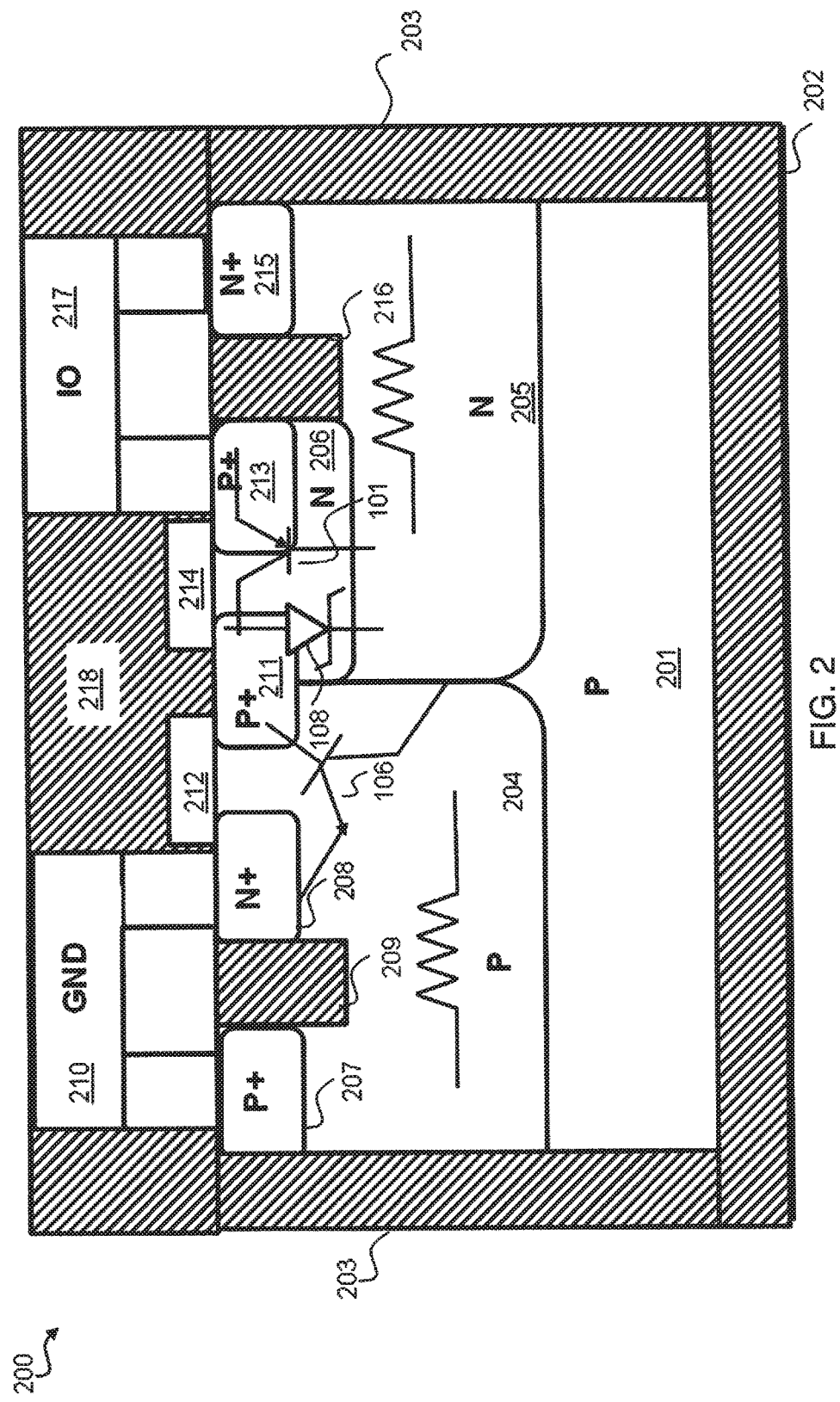
FIG. 2 is a simplified diagram of a cross-section through a first example of an electrostatic discharge protection device.

A first example of an ESD protection device structure will now be described with reference to FIG. 2. The structure described below with reference to FIG. 2 may be considered to be an implementation of the simplified circuit diagram of FIG. 1A.

An ESD protection device structure 200 may comprise a substrate 201, an insulating layer 202 below the substrate 201 and insulating side walls 203 at the sides of the substrate. The insulating layer 202 below the substrate may be a buried oxide layer. The side walls 203 may comprise deep trench isolation regions. In one example, the substrate may be a P type substrate. In another example embodiment, the substrate may be an N-type substrate, A first type well 204 may be formed within the substrate 201. In the example of FIG. 2, the first type well 204 may be a P type well.

A second type well 205 may be formed within the substrate 201 and may be contiguous with the first type well 204. Both wells 204, 205 may extend the same depth into the substrate 201. In the example of FIG. 2 the second type well 205 may be an N type well. A doped part 206 (of the same type as the second type well 205) may be formed in an upper region of the second type well 205 and adjacent to the first type well 204. The doped part 206 in the second type well 205 may have a higher doping level than that of the second type well 205.

A first, first type doped region 207, which may be a P type doped region, may be formed within an upper region of the first type well 204. A first, second type doped region 208, which may be an N type doped region, may be formed within an upper region of the first type well 204, adjacent to the first, first type doped region but separated therefrom by a first shallow trench isolation region 209. The first, first type doped region 207 and the first, second type doped region 208 may be short-circuited by a first conducting link 210 and may together comprise a device terminal, which may be a ground terminal 107 (see FIG. 1A,B,C) of the ESD device.

A second, first type doped region 211, which may be a P-type doped region may be formed partly in an upper region of the first type well 204 and partly in the doped area 206 and separated from the first, second type doped region 208 by a first nitride spacer 212.

The second type well 205, the second, first type doped region 211 and the first, second type doped region 208 may constitute a transistor and in one embodiment, may constitute the NPN transistor 106 of FIGS. 1A,B,C.

The second, first type doped region 211 and the doped part 206 may constitute the terminals of a trigger diode. The trigger diode may be a Zener diode whose breakdown voltage may be set by the doping levels of the doped part 206. In some embodiments, the doped part 206 may comprise a lightly doped drain (ldd) region. That is to say that the doped part 206 may be lighter doped than the first, second type region 208, for example, but still more highly doped than the second type well 205. In one example embodiment, a Zener diode breakdown voltage may be controlled by implants into the second type well 205. In one example, where the second, first type doped region 211 is P-type and the doped part 206 is N-type, the second, first type doped region 211 and the doped part 206 may constitute, respectively, the anode and cathode of the Zener diode 108 of FIGS. 1A,B,C Using this method for controlling breakdown voltage advantageously obviates any need for any additional layers as is required in some known designs. Thus, this may assist in reducing device size.

A third, first type doped region 213, which may be a P-type doped region may be formed in an upper region of the doped part 206 and separated from the second, first type doped region 211 by a second nitride spacer 214. The third, first type doped region 213, the doped part 206 and the second, first type doped region 211 may constitute a transistor and in one embodiment may constitute the PNP transistor 101 of FIGS. 1A,B,C.

A second, second type doped region 215, which may be an N-type doped region, may be formed in an upper region of the second type well 205 and separated from the third, first type doped region 213 by a second, shallow trench isolation region 216. The second, second type doped region 215 and the third, first type doped region 213 may be short-circuited by a second conducting link 217 and comprise a terminal of the device which may be an input/output terminal 102 (see FIGS. 1A,B,C) of the ESD device.

The first and second conducting links 210 and 217 which may comprise the ground and input/output terminals of the ESD device may be isolated from one another by an upper oxide layer 218.

The use of nitride spacers, rather than gate oxides as is used in some known arrangements, ameliorates the problems of leakage current. In one example a silicide mask may be used in order to form the nitride spacers. The use of nitride spacers for separating certain doped regions also advantageously allows SCR current to flow in a lateral sense. Furthermore, adjustment of the spacing between the second and third first type doped regions 211, 213 permits easy control of the collector-emitter voltage of the PNP transistor 101 and therefore control of its activation. Therefore, the dimensions of the nitride spacers may control collector-emitter voltages of the transistors 101, 106.

Figure 3:
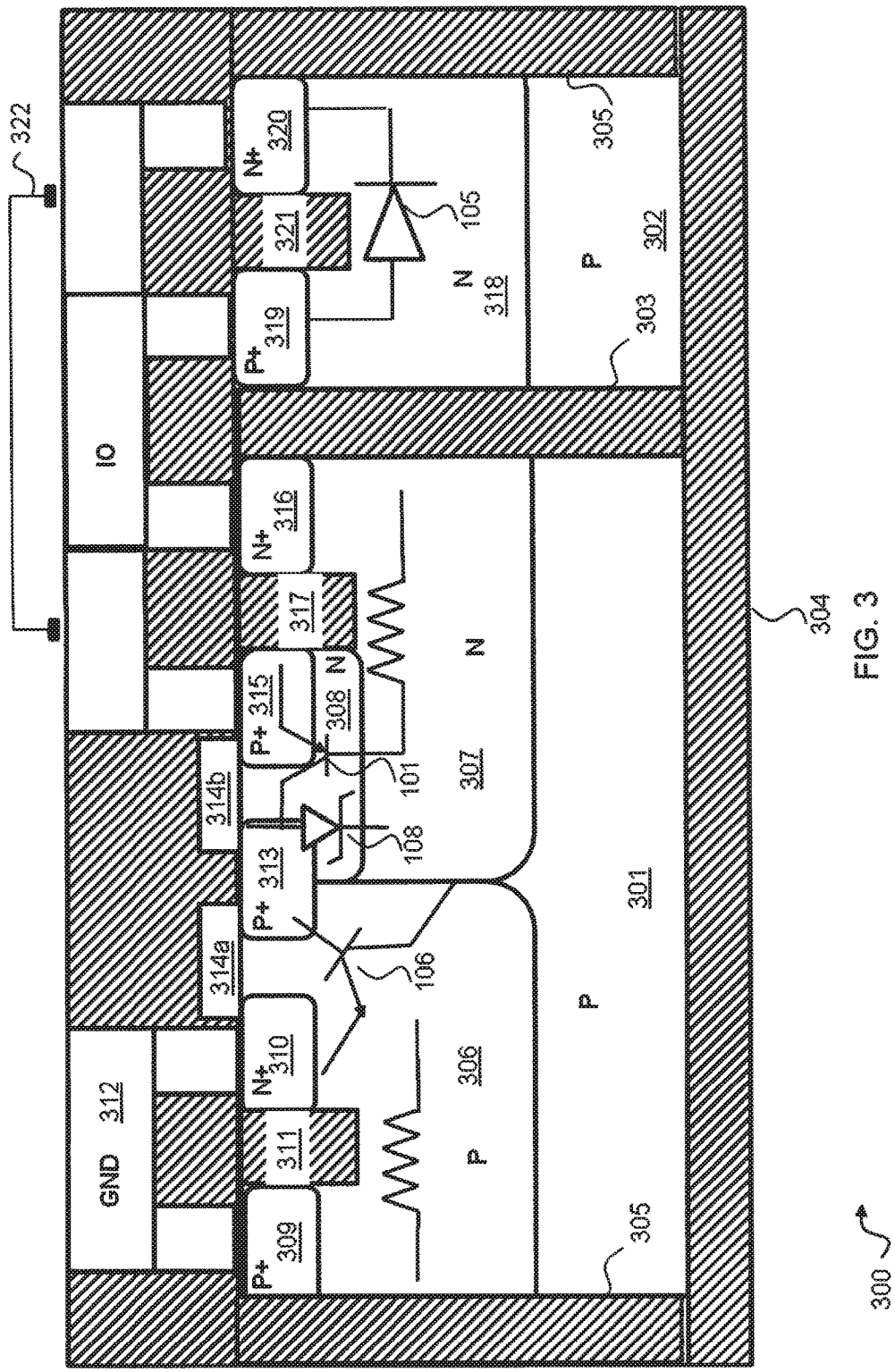
FIG. 3 is a simplified diagram of a cross-section through a second example of an electrostatic discharge protection device.

A second example of an ESD protection device structure will now be described with reference to FIG. 3. The structure described below with reference to FIG. 3 may be considered to be an implementation of the simplified circuit diagram of FIG. 1B.

An ESD protection device structure 300 may comprise a substrate, which may be separated into first and second parts 301 and 302 by a deep trench isolation region 303. An insulating layer 304 may be provided below the two parts of the substrate and insulating side walls 305 at the sides of the substrate may also be provided. The insulating layer 304 below the substrate may be a buried oxide layer. The side walls 305 may comprise deep trench isolation regions. In one example, the first type substrate may be a P type substrate. In another alternative example, the substrate may be an N-type substrate.

A first type well 306 may be formed within the first part 301 of the substrate. In the example of FIG. 2, the first type well may be a P type well.

A second type well 307 may be formed within the first part 301 of the substrate and may be contiguous with the first type well 306. Both wells 306, 307 may extend the same depth into the first part 301 of the substrate. In the example of FIG. 3 the second type well 307 may be an N type well. A doped part 308 (of the same type as the second type well 307) may be formed in an upper region of the second type well 307 and adjacent to the first type well 306. The doped part 308 in the second type well 307 may have a higher doping level than that of the second type well 307.

A first, first type doped region 309, which may be a P type doped region, may be formed within an upper region of the first type well 306. A first, second type doped region 310, which may be an N type doped region, may be formed within an upper region of the first type well 306, adjacent to the first, first type doped region 309 but separated therefrom by a first shallow trench isolation region 311. The first, first type doped region 309 and the first, second type doped region 310 may be short-circuited by a first conducting link 312 and may together comprise a device terminal which may be a ground terminal 107 (see FIG. 1A,B,C) of the ESD device.

A second, first type doped region 313, which may be a P-type doped region may be formed partly in an upper region of the first type well 306 and partly in the doped part 308 and coupled with the first, second type doped region 310 by a first nitride spacer 314a.

The second type well 307, the second, first type doped region 313 and the first, second type doped region 310 may constitute a transistor and in one embodiment, may constitute the NPN transistor 106 of FIGS. 1A,B,C.

The second, first type doped region 313 and the doped part 308 may constitute the terminals of a trigger diode. The trigger diode may be a Zener diode whose breakdown voltage may be set by the doping levels of the doped part 308. In some embodiments, the doped part 308 may comprise a lightly doped drain (ldd) region. That is to say that the doped part 308 may be lighter doped than the first, second type region 310, for example, but still more highly doped than the second type well 307. In one example embodiment, a Zener diode breakdown voltage may be controlled by implants into the second type well 307. In one example, where the second, first type doped region 211 is P-type and the doped part 206 is N-type, the second, first type doped region 211 and the doped part 206 may constitute, respectively, the anode and cathode of the Zener diode 108 of FIG. 2 1A,B,C A third, first type doped region 315, which may be a P-type doped region may be formed in an upper region of the doped part 308 and separated from the second, first type doped region 313 by a second nitride spacer 314b. The third, first type doped region 315, the doped part 308 and the second, first type doped region 313 may constitute a transistor and in one embodiment may constitute the PNP transistor 101 of FIGS. 1A,B,C.

A second, second type doped region 316, which may be an N-type doped region, may be formed in an upper region of the second type well 307 and separated from the third, first type doped region 315 by a second, shallow trench isolation region 317. The second, second type doped region 316 may comprise a terminal which may be an input/output terminal 102 (see FIGS. 1A,B,C) of the ESD device.

The second part 302 of the substrate may have formed therein a second type well 318. In one example, this second type well 318 may comprise an N type well and may extend to the same depth as the wells 306, 307 which may be formed in the first part 301 of the substrate. In an upper part of the second type well 318 which is formed in the second part 302 of the substrate, a first type doped region 319 and a second type doped region 320 may be formed and separated from each other by a third shallow trench isolation region 321.

These doped regions of first and second type which are formed in the second type well in the second part 302 of the substrate may comprise the terminals of a diode. In one example, where the first type doped region 319 is P-type and the second type doped region 320 and the second type well 316 are N-type, the first type doped region 319 and the second type well 415 may constitute the (PN junction) diode 105 of FIG. 1B. The diode 105 is isolated from the rest of the device structure 300 by the deep trench isolation region 303.

An anode of the diode 105, that is, the first type doped region 319, may comprise the output terminal 102 of the device. A cathode of the diode 105, that is, the second type doped region 320, may be operably coupled via an external link 322 to the third first type doped region 315 that is to the emitter of the transistor 101

A third example of an ESD circuit structure will now be described with reference to FIG. 4. The structure described below with reference to FIG. 4 may be considered to be an implementation of the simplified circuit diagram of FIG. 1C.

An ESD protection device structure 400 may comprise a substrate, which may be separated into first, second and third parts 401, 402a and 402b respectively, by two deep trench isolation regions 403a. 403b. An insulating layer 404 may be provided below the three parts of the substrate and insulating side walls 405 at the sides of the substrate may also be provided. The insulating layer 404 below the substrate may be a buried oxide layer. The side walls 405 may comprise deep trench isolation regions. In one example, the substrate may be a P type substrate. In an alternative example embodiment, the substrate may be an N-type substrate.

A first type well 406 may be formed within the first part 401 of the first type substrate. In the example of FIG. 2, the first type well may be a P type well.

A second type well 407 may be formed within the first part 401 of the substrate and may be contiguous with the first type well 406. Both wells 406, 407 may extend the same depth into the first part 401 of the substrate. In the example of FIG. 4 the second type well 407 may be an N type well. A doped part 408 (of the same type as the second type well 407) may be formed in an upper region of the second type well 407 and adjacent to the first type well 406. The doped part 408 in the second type well 407 may have a higher doping level than that of the second type well 407.

A first, first type doped region 409, which may be a P type doped region, may be formed within an upper region of the first type well 406. A first, second type doped region 410, which may be an N type doped region, may be formed within an upper region of the first type well 406, adjacent to the first, first type doped region 409 but separated therefrom by a first shallow trench isolation region 411. The first, first type doped region 409 and the first, second type doped region 410 may be short-circuited by a first conducting link 412 and may together comprise a device terminal which may be a ground terminal 107 (see FIG. 1A,B,C) of the ESD device.

A second, first type doped region 413, which may be a P-type doped region may be formed partly in an upper region of the first type well 406 and partly in the doped part 408 and separated from the first, second type doped region 410 by a first nitride spacer 414a.

The second type well 407, the second, first type doped region 413 and the first, second type doped region 410 may constitute a transistor and in one embodiment, may constitute the NPN transistor 106 of FIGS. 1A,B,C.

The second, first type doped region 413 and the doped part 408 may constitute the terminals of a trigger diode. The trigger diode may be a Zener diode whose breakdown voltage may be set by the doping levels of the doped part 408. In some embodiments, the doped part 408 may comprise a lightly doped drain (ldd) region. That is to say that the doped part 408 may be lighter doped than the first, second type region 410, for example, but still more highly doped than the second type well 407 In one example embodiment, a Zener diode breakdown voltage may be controlled by implants into the second type well 407. In one example, where the second, first type doped region 413 is P-type and the doped part 408 is N-type, the second, first type doped region 413 and the doped part 408 may constitute, respectively, the anode and cathode of the Zener diode 108 of FIG. 2 1A,B,C.

A third, first type doped region 415, which may be a P-type doped region may be formed in an upper region of the doped part 408 and separated from the second, first type doped region 413 by a second nitride spacer 414b. The third, first type doped region 415, the doped part 508 and the second, first type doped region 413 may constitute a transistor and in one embodiment may constitute the PNP transistor 101 of FIGS. 1A,B,C.

A second, second type doped region 416, which may be an N-type doped region, may be formed in an upper region of the second type well 407 and separated from the third, first type doped region 615 by a second, shallow trench isolation region 417. The second, second type doped region 416 may comprise a terminal which may comprise an input/output terminal 102 (see FIGS. 1A,B,C) of the ESD device.

The second part 402a of the substrate may have formed therein a second type well 418. In one example, this second type well 418 may comprise an N type well and may extend to the same depth as the wells 406, 407 which may be formed in the first part 401 of the substrate. In an upper part of the second type well 418 which is formed in the second part 402a of the substrate, a first type doped region 419 and a second type doped region 420 may be formed and separated from each other by a third shallow trench isolation region 421.

These doped regions 419, 420 of first and second type which are formed in the second type well in the second part 402a of the substrate may comprise the terminals of a diode. In one example, where the first type doped region 419 is P-type and the well 418 and second type doped region 320 are N-type, the first type doped region 319 and the second type well 418 may constitute the (PN junction) diode 105 of FIG. 1C. The diode 105 may be isolated from the rest of the device structure 400 by the deep trench isolation region 403. An anode of the diode 105, that is the first type doped region 419, may comprise an input/output terminal of the device 400.

The third part 402b of the substrate may have formed therein a second type well 422. In one example, this second type well 422 may comprise an N type well and may extend to the same depth as the wells 406, 407 which may be formed in the first part 401 of the substrate. In an upper part of the second type well 422 which is formed in the third part 402b of the substrate, a first type doped region 423 and a second type doped region 424 may be formed and separated from each other by a fourth shallow trench isolation region 425.

These doped regions 423, 424 of first and second type which are formed in the second type well in the third part 402b of the substrate may comprise the terminals of a further diode. In one example, where the first type doped region 423 is P-type and the well 422 and second type doped region 424 are N-type, the first type doped region 423 and the second type well 422 may constitute the (PN junction) diode 105 of FIG. 1C. The diode 105 may be isolated from the rest of the device structure 400 by the deep trench isolation region 403b. An anode of the diode 105, that is the first type doped region 423, may be short-circuited to the cathode of the diode 104 by a conducting link 426. A cathode of the diode 105 comprising the second type doped region 424 may be operably coupled via an external link 427 to the third first type doped region 415 that is to the emitter of the transistor 101 In this way, the two diodes 104, 105 may be connected in series between the input/output terminal of the device 400 and the emitter of the transistor 101.

Figure 4:
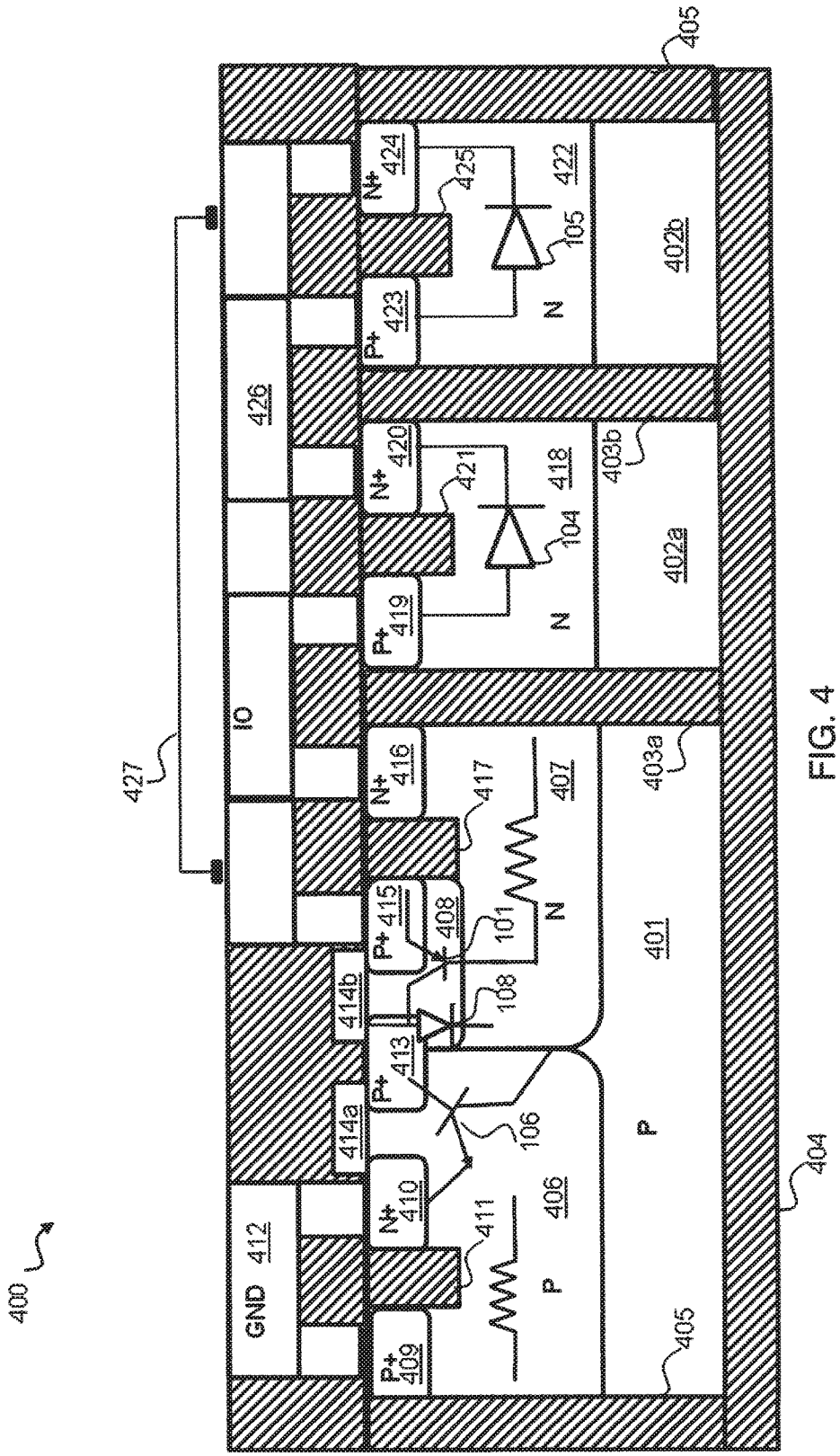
FIG. 4 is a simplified diagram of a cross-section through a third example of an electrostatic discharge protection device.

It will be appreciated by those skilled in the art that further series diodes may be included in the ESD structure of FIG. 4 by replicating a sub-structure comprising the well 422, doped regions 423 and 424, isolating them from the rest of the structure by means of further deep trench isolation regions and by forming the necessary interconnections. In this way, a snap back voltage can be readily adjusted.

Figure 5:
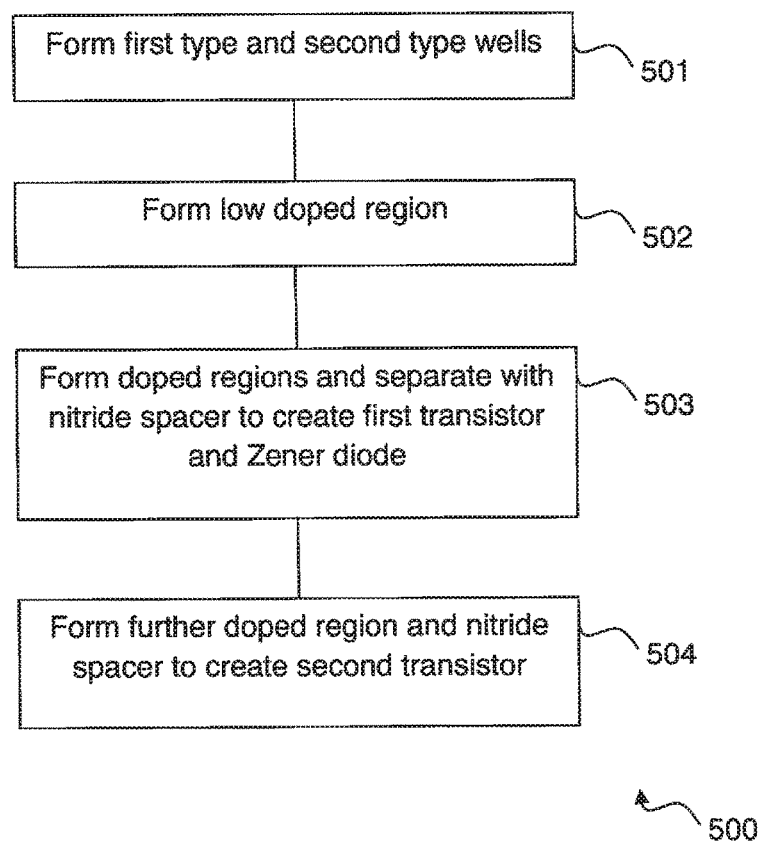
FIG. 5 is a simplified flowchart of a first example of a method of manufacturing an electrostatic discharge protection device.

FIG. 5 is a simplified flowchart of an example of a method 500 for manufacturing an ESD protection device structure on a substrate. The method may include providing an insulating layer below the substrate and insulating side walls at the sides of the substrate. The insulating layer below the substrate may be a buried oxide layer. The side walls may comprise deep trench isolation regions. In one example, the first type substrate may be a P type substrate. In an alternative example, the substrate may be an N-type substrate.

At 501, first type well and a second type well may be formed within the substrate. In one example, the first type well may be a P type well and the second type well may be an N-type well. The second type well and may be contiguous with the first type well and both wells may extend the same depth into the substrate.

At 502, doped part (of the same type as the second type well) may be formed in an upper region of the second type well and adjacent to the first type well.

At 503, a second type doped region, which may be an N type doped region, may be formed within an upper region of the first type well. A, first type doped region, which may be a P-type doped region may also be formed, partly in an upper region of the first type well and partly in the doped part. These two doped regions may be separated by a first nitride spacer. The second type well, the first type doped region and the second type doped region may constitute a first transistor. Further, the, first type doped region and the doped part may constitute a trigger diode. The trigger diode may be a Zener diode whose breakdown voltage may be set by the doping levels of the doped part.

In some embodiments, the doped part may comprise a lightly doped drain (ldd) region which is more heavily doped than the second type well but more lightly doped than the second type doped region, for example. In one example embodiment, a Zener diode breakdown voltage may be controlled by implants into the second type well. In one example, where the second, first type doped region is P-type and the doped part is N-type, the second, first type doped region and the doped part may constitute, respectively, the anode and cathode of a Zener diode.

At 504, a further first type doped region, which may be a P-type doped region may be formed in an upper region of the doped par 206 and separated from the first type doped region by a second nitride spacer. The further, first type doped region, the doped part and the first type doped region may constitute a second transistor.

Figure 6:
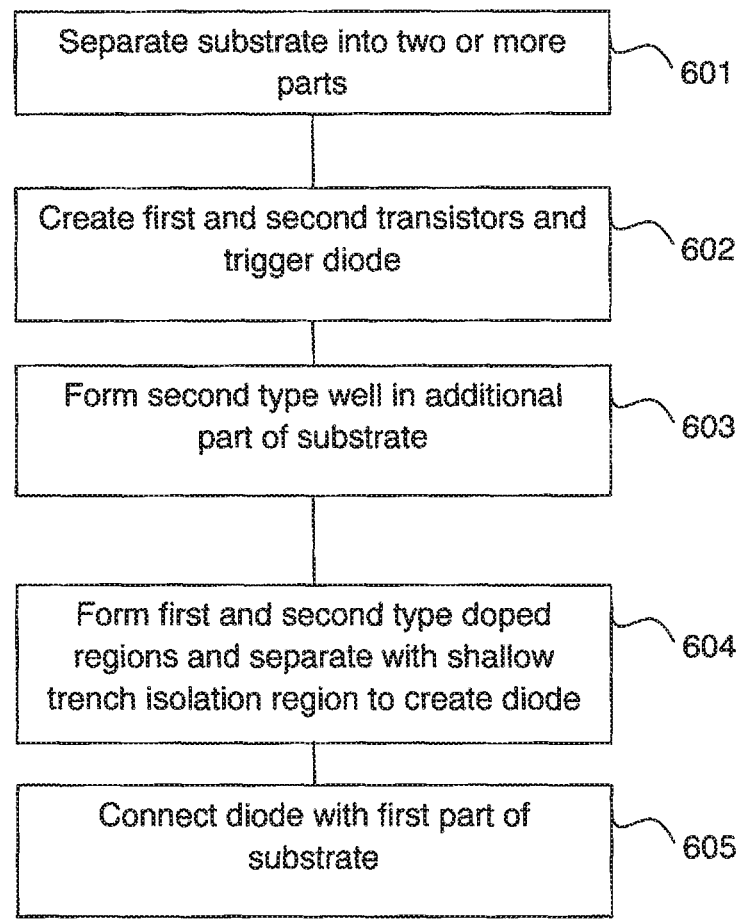
FIG. 6 is a simplified flowchart of a second example of a method of manufacturing an electrostatic discharge protection device.

An alternative example of a method 600 of manufacturing an ESD device structure is illustrated in the simplified flowchart of FIG. 6 where at 601, a substrate may be separated into two or more parts by deep trench isolation regions provided between adjacent parts. The substrate may be a P-type substrate or in an alternative embodiment, may be an N-type substrate.

At 602, the method may progress in accordance with the method described with reference to FIG. 5 in respect of a first part of the substrate in order to create two transistors and a trigger diode.

At 603, a second type well may be formed in a second or additional parts of the substrate. In one embodiment, this second type well may be an N-type well.

At 604, first and second type doped regions may be formed in the second type well and separated from each other by a shallow trench isolation region to create the terminals of a diode. In one embodiment, the first type doped region may be a P-type region and the second type region may be an N-type region and the diode may be a PN junction diode.

At 605, the diode may be connected with the structure formed in the first part of the substrate by connecting the first and second type doped regions between a terminal of the ESD device structure and the further, first type doped region.

In the foregoing specification, the invention has been described with reference to specific examples of embodiments of the invention. It will, however, be evident that various modifications and changes may be made therein without departing from the broader spirit and scope of the invention as set forth in the appended claims. For example, the substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" "above" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples of an ESD protection device structure may be implemented as circuitry implemented in a single integrated circuit or within a device which the circuit is protecting against ESD events. That is to say that an ESD protection device structure may be may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and which are connectable to other components outside the package through suitable connections such as pins of the package and bondwires between the pins and the dies.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An electrostatic discharge, ESD, protection device structure comprising a substrate having a first part,
 a first type well formed within the first part of the substrate,
 a second type well formed within the first part of the substrate,
 a doped part of a second type formed in an upper region of the second type well
 a second type doped region formed within an upper region of the first type well,
 a first type doped region formed partly in an upper region of the first type well and partly in the doped part and separated from the second type doped region by a first nitride spacer,
 wherein the second type well, the first type doped region and the second type doped region constitute a first transistor and wherein the first type doped region and the doped part constitute a trigger diode,
 and a further first type doped region formed in an upper region of the doped part and separated from the first type doped region by a second nitride spacer, wherein the further, first type doped region, the doped part and the first type doped region constitute a second transistor.

2. The ESD protection device structure of claim 1, wherein the substrate comprises at least one additional part separated from parts adjacent thereto by a deep trench isolation region and wherein each additional part of the substrate has formed therein a second type well in an upper part of which are formed a first type doped region and a second type doped region, separated from each other by a shallow trench isolation region, wherein said doped regions of first and second type which are formed in the second type well in each additional part of the substrate constitute the terminals of a diode.

3. The ESD protection structure of claim 2, wherein the substrate comprises one additional part and wherein the diode formed therein is connected between a terminal of the ESD device structure and the further, first type doped region.

4. The ESD protection device structure of claim 2, wherein the substrate comprises multiple additional parts and wherein diodes formed in the multiple additional parts are connected in series with one another to form a diode arrangement and wherein the diode arrangement is connected between a terminal of the ESD device structure and the further, first type doped region.

5. The ESD protection circuit device of claim 2, comprising a buried oxide layer below the substrate and side walls comprising deep trench isolation regions.

6. The ESD protection device structure of claim 1, wherein the first type well and the second type well which are formed in the first part of the substrate are contiguous with one another.

7. The ESD protection device structure of claim 1, wherein the first type well and the second type well which are formed in the first part of the substrate extend to the same depth into the substrate.

8. The ESD protection device structure of claim 1, wherein the doped part is formed in the second type well in a region of the second type well which is adjacent to the first type well.

9. The ESD protection device structure of claim 1, wherein the trigger diode comprises a Zener diode whose breakdown voltage is set by doping levels of the doped part.

10. The ESD protection device structure of claim 1, comprising a first type doped region formed within the first type well and separated from the second type doped region formed within the first type well by a shallow trench isolation region and wherein said first type and second type doped regions formed within the first type well comprise a terminal of the ESD protection device.

11. The ESD protection device structure of claim 1, comprising a second type doped region formed within the second type well and separated from the further first type doped region formed within the second type well by a shallow trench isolation region and wherein said second type doped region formed within the second type well comprises a terminal of the ESD protection device.

12. The ESD protection circuit structure of claim 1, wherein a first type is a P-type and a second type is an N-type and the first transistor is an NPN transistor and the second transistor is a PNP transistor.

13. The ESD protection circuit structure of claim 1, wherein the ESD protection circuit structure is implemented in an integrated circuit device.

14. A method of manufacturing an electrostatic discharge, ESD, protection device on a substrate, the method comprising;
forming a first transistor and a trigger diode, comprising:
forming a first type well and a second type well in a first part of the substrate;
forming a doped part of a second type in the second type well,
forming a second type doped region in the first type well, a first type doped region partly in the first type well and partly in the second type well; and
forming a nitride spacer between the second type doped region and the first type doped region;
the first transistor comprising the second type well, first type doped region and second type doped region, and the first type doped region and a trigger diode comprising the doped part, the trigger diode having a breakdown voltage set by a doping level of the doped part;
forming a second transistor comprising:
forming a further first type doped region in the doped part and a second nitride spacer between the further, first type doped region and the first type doped region, the second transistor comprising the further first type doped region, the doped part and the first type doped region.

15. The method of claim 14 comprising separating at least one additional part of the substrate from the first part with a deep trench oxide layer, forming a second type well in an additional part of the substrate, forming a first type doped region and a second type doped region in the second type well of the additional part and separating said first and second type doped regions from each other by a shallow trench isolation region, wherein said doped regions of first and second type which are formed in the second type well in each additional part of the substrate constitute the terminals of a diode.

* * * * *